(12) United States Patent
Brand

(10) Patent No.: US 6,355,506 B1
(45) Date of Patent: Mar. 12, 2002

(54) METHOD OF FORMING HEAT SINK AND SEMICONDUCTOR CHIP ASSEMBLIES

(75) Inventor: Joseph M. Brand, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/651,789

(22) Filed: Aug. 30, 2000

Related U.S. Application Data

(63) Continuation of application No. 09/059,875, filed on Apr. 14, 1998, now Pat. No. 6,114,190.

(51) Int. Cl.[7] ............................................. H01L 21/44
(52) U.S. Cl. ..................... 438/122; 438/123; 438/124
(58) Field of Search ................................. 438/122, 123, 438/124; 29/827

(56) References Cited

U.S. PATENT DOCUMENTS

| | | | |
|---|---|---|---|
| 5,065,281 A | 11/1991 | Hernandez et al. | 361/388 |
| 5,106,451 A | 4/1992 | Kan et al. | 438/122 |
| 5,482,898 A | 1/1996 | Marrs | D437/216 |
| 5,808,359 A | * 9/1998 | Muto et al. | |
| 5,822,848 A | * 10/1998 | Chiang | |

* cited by examiner

*Primary Examiner*—Caridad Everhart
(74) *Attorney, Agent, or Firm*—Workman, Nydegger & Seeley

(57) ABSTRACT

Methods for applying a heat sink to a semiconductor chip. A heat sink frame is removably attached to one or more heat sinks and is used to align the heat sinks with corresponding semiconductor chips. The semiconductor chips are preferably positioned on a semiconductor chip frame. The heat sinks are aligned with the semiconductor chips either before or after the semiconductor chips are substantially encapsulated within a molding material. The heat sink frame is detached from the heat sinks at a selected time after the heat sinks and the semiconductor chips have been aligned, whereby the heat sinks remain combined with the semiconductor chips. Detachment of the heat sink frame may be conducted before or, alternatively, after the semiconductor chips have been encapsulated. The methods of the invention facilitates the efficient and reliable application of heat sinks to semiconductor chips.

17 Claims, 7 Drawing Sheets

METHOD OF FORMING HEAT SINK AND SEMICONDUCTOR CHIP ASSEMBLIES

RELATED APPLICATIONS

This is a continuation of U.S. patent application Ser. No. 09/059,875, filed on Apr. 14, 1998, now U.S. Pat. No. 6,114,190 titled "Method of Forming Heat Sink and Semiconductor Chip Assemblies", which is incorporated herein by reference.

BACKGROUND OF THE INVENTION

1. The Field of the Invention

The present invention relates to methods for forming heat sink and semiconductor chip assemblies. More particularly, the present invention relates to methods for attaching heat sinks to semiconductor chips, wherein the heat sinks are aligned with the corresponding semiconductor chips using a detachable heat sink frame.

2. The Relevant Technology

After a semiconductor chip, such as an integrated circuit, has been manufactured, the semiconductor chip is typically subjected to a packaging process in which it is placed in a condition to be shipped to the consumer or to be used in a manufactured product. Chip packaging has a number of purposes, including protecting the semiconductor chip from environmental conditions, improving the ease of handling or transporting the semiconductor chip, allowing the semiconductor chip to be mounted to a printed circuit board or other external circuitry, and improving the thermal properties of the semiconductor chip. As the structures and circuitry contained within semiconductor chip devices continue to become smaller, it becomes increasingly important for the heat generated during operation of the semiconductor chip to be efficiently removed. Otherwise, overheating may occur, which can cause the breakdown or failure of the semiconductor chip.

One common method for improving the thermal properties of a semiconductor chip is the use of a heat sink to provide a conductive path for the elimination of excess heat. Heat sinks function in one or more of at least two ways. First, heat sinks preferably have relatively high thermal conductivity properties in order to efficiently allow heat to flow from the semiconductor chip and into or through the heat sink. Second, heat sinks preferably have relatively high specific heat values, which are a measure of a material's ability to store thermal energy. Heat sinks further enhance heat removal if they are in intimate contact with the semiconductor chip over a relatively large area and if the heat sink has a relatively large and efficient interface with the outside environment. Heat sinks may be advantageously formed from metals, common examples of which include nickel, copper, palladium, alloys of the foregoing, and the like. More generally, heat sinks may be constructed from substantially any metal or metal alloy and from some suitable non-metals.

Heat sinks may be attached to or combined with semiconductor chips according to various methods. For example, adhesives may be used to directly attach a heat sink to a semiconductor chip. Alternatively, a heat sink and a semiconductor chip may be encapsulated together using common polymeric materials. In this case, the encapsulating polymeric material further serves to protect the semiconductor chip from environmental conditions.

Conventionally, heat sinks have been combined with semiconductor chips by individually manipulating each heat sink and placing it on or near its corresponding semiconductor chip. Frequently, heat sinks are placed in position with a semiconductor chip shortly before or after a molding step in which the semiconductor chip is substantially encapsulated. It has been found, however, that certain problems are associated with applying heat sinks to semiconductor chips. For example, because the width and length dimensions of conventional heat sinks are often no greater than several millimeters, and may be substantially smaller, it is often difficult to reliably and efficiently align heat sinks with their corresponding semiconductor chips, particularly in high throughput manufacturing settings. It is therefore common for heat sinks to be misaligned with semiconductor chips, to become dislodged before the molding process, or to otherwise fail to be properly positioned. When this occurs, the packaged semiconductor chip may be rendered inoperable or the. manufacturing process may be disrupted.

In view of the foregoing, it would be an advancement in the art to provide methods for reliably and efficiently aligning and combining heat sinks with corresponding semiconductor chips. Furthermore, there is a need in the art for such methods to be compatible with common molding processes that are used to encapsulate semiconductor chips. Such heat sink application methods would be particularly advantageous if they could be reliably conducted without the heat sinks becoming dislodged or misplaced before, during, or after the molding process is conducted.

SUMMARY OF THE INVENTION

The present invention relates to methods for combining heat sinks with semiconductor chips wherein the heat sinks are placed in their desired positions using a detachable heat sink frame that is removed shortly before or after a molding process is conducted on the semiconductor chips. The methods involve the use of a heat sink frame having one or more heat sinks removably attached thereto. The heat sink frame is aligned with a semiconductor chip frame that has one or more corresponding semiconductor chips attached thereto. After the frames are aligned, the heat sink frame is detached from heat sinks, whereby the heat sinks remain assembled with the semiconductor chips.

Preferably, the heat sinks are positioned in a generally linear arrangement within a strip-like frame. The heat sinks may be advantageously attached to the frame at a number of contact points on the periphery thereof. Attachment of the heat sinks in this manner facilitates the detachment of the heat sink frame. In particular, the contact points may be easily broken in order to release the heat sinks.

The heat sink frames of the invention are preferably used in combination with semiconductor chip frames having one or more semiconductor chips arrayed thereon in substantially the same pattern as the heat sinks. For example, the semiconductor chip frame may be a strip on which the semiconductor chips are arrayed in a generally linear fashion. Accordingly, when the heat sink frame with its heat sinks is positioned generally over and in proximity to the semiconductor chip frame with its semiconductor chips, the heat sinks and semiconductor chips may be combined in a one to one relationship in heat sink and chip assemblies.

According to a first embodiment of the invention, the heat sink frame is aligned with the semiconductor chip frame before a molding process has been conducted. The resulting dual frame assembly is then positioned at a molding surface of a molding machine. While the dual frame assembly is at the molding surface, the heat sink frame is detached from the heat sinks, leaving the heat sinks on the corresponding semiconductor chips. A molding process is then conducted on the heat sink and chip assemblies, whereby a molding material substantially encapsulates both the heat sinks and the semiconductor chips.

The resulting chip package assemblies are removed from the molding surface after the molding step. Excess material is then trimmed from the encapsulation material as needed. According to this embodiment of the invention, chip package assemblies are formed in which the heat sinks and the semiconductor chips are encapsulated together. Using the heat sink frame to align the heat sinks with the semiconductor chips has the advantage of accurately positioning the heat sinks and holding them in place until just prior to the molding process.

In a second embodiment of the invention, the heat sink frame and the semiconductor chip frame are aligned prior to the molding step in much the same manner as in the first embodiment. Likewise, the dual frame assembly is positioned at the molding surface. However, according to this embodiment, the heat sink and chip assemblies are encapsulated without prior detachment of the heat sink frame. After the molding step is conducted, the resulting encapsulated assemblies are removed from the molding surface and excess material is trimmed from encapsulation material as needed.

In this embodiment, the heat sink frame may be detached from the heat sinks at any time after the molding process is completed. For example, detachment of the heat sink frame may be conducted while the encapsulated assembly remains positioned on the molding surface. This step may instead be performed during or after removal of the encapsulated assembly from the molding surface. Furthermore, detachment of the heat sink frame may occur before or during the optional step of trimming excess material from the encapsulation material.

Like other embodiments of the invention, this second embodiment has the advantage of allowing the heat sinks to be accurately aligned with the corresponding semiconductor chips. Furthermore, encapsulating the heat sink and chip assemblies with the heat sink frame attached ensures that the heat sinks remain in the desired position during the molding process.

According to a third embodiment of the invention, the semiconductor chip frame with its associated semiconductor chips is placed at the molding surface without the heat sink frame. Next, a molding step is used to substantially encapsulate the semiconductor chips. At some point after the molding step, the heat sink frame is aligned with the encapsulated semiconductor chips. For example, the heat sink frame may be applied immediately after the molding step while the semiconductor chip frame is still on the molding surface. Alternatively, alignment of the heat sink frame may be conducted during or after removal of the encapsulated semiconductor chips from the molding surface.

After the heat sinks have been positioned on or near the encapsulated semiconductor chips, the heat sink frame is detached from the rest of the assembly. As a result, the heat sinks remain positioned over the encapsulation layer formed during the molding process. Adhesion between the heat sinks and the encapsulation layer may be maintained by providing an adhesive layer therebetween. In some cases, however, depending on the molding material used, the heat sinks may be secured in place without the use of an additional adhesive material. Specifically, in some instances the heat sinks can be caused to adhere directly to the encapsulation layer by placing the heat sinks on the encapsulation layer before the molding material has fully cured.

In this embodiment, the heat sink frame is used to accurately and efficiently position the heat sinks over the semiconductor chips. Moreover, the heat sinks are not present during the molding process and therefore are not subject to being dislodged.

According to any of the embodiments of the invention, it is seen that the shortcomings of the prior art are overcome. For example, the heat sink frame provides a structure for allowing a plurality of heat sinks to be simultaneously manipulated. Thus, the need for individually handling the heat sinks is eliminated. The invention allows the heat sinks to be accurately and reliably applied to semiconductor chips without the risk of becoming misaligned or misplaced, as was previously common. Furthermore, the methods of the invention may be adapted for use with the various molding machines and other processing equipment that are used in the art in order to provide an efficient, high throughput, chip packaging process.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The present invention is directed to methods of attaching heat sinks to semiconductor chips using a heat sink frame removably attached to the heat sinks. The heat sink frame is used to align the heat sinks with corresponding semiconductor chips, which are s preferably positioned on a semiconductor chip frame. The step of aligning the heat sink frame with the semiconductor chip frame may be conducted either before or after a molding operation is conducted, wherein the semiconductor chips are at least partially encapsulated with molding material.

If the frames are aligned before the molding operation, the individual heat sinks may be detached from the heat sink frame either before or after the molding operation. If the heat sink frame is instead aligned after the molding operation, the heat sinks are detached from the heat sink frame preferably either shortly after the molding operation has been conducted or before or during a step of trimming excess material from the encapsulation layer.

As used herein, the term "semiconductor chip" is intended to extend to structures or devices that include a semiconductive material. Semiconductor chips are typically discrete devices having integrated circuitry formed therein. The term "heat sink", as used herein, includes structures or devices that may be used to remove and/or store heat generated during the operation of a semiconductor chip. As used herein, the term "frame" is defined to include any superstructure that supports, aligns, carries, attaches to, or physically constrains one or more sub-components, such as heat sinks or semiconductor chips.

The invention may be best understood by referring to the figures which depict various embodiments of the invention. FIGS. 1–6 illustrate a first embodiment of the invention, in which the heat sink frame is aligned with the semiconductor chip frame and the heat sinks are singulated before a molding operation is conducted.

Figure 1:
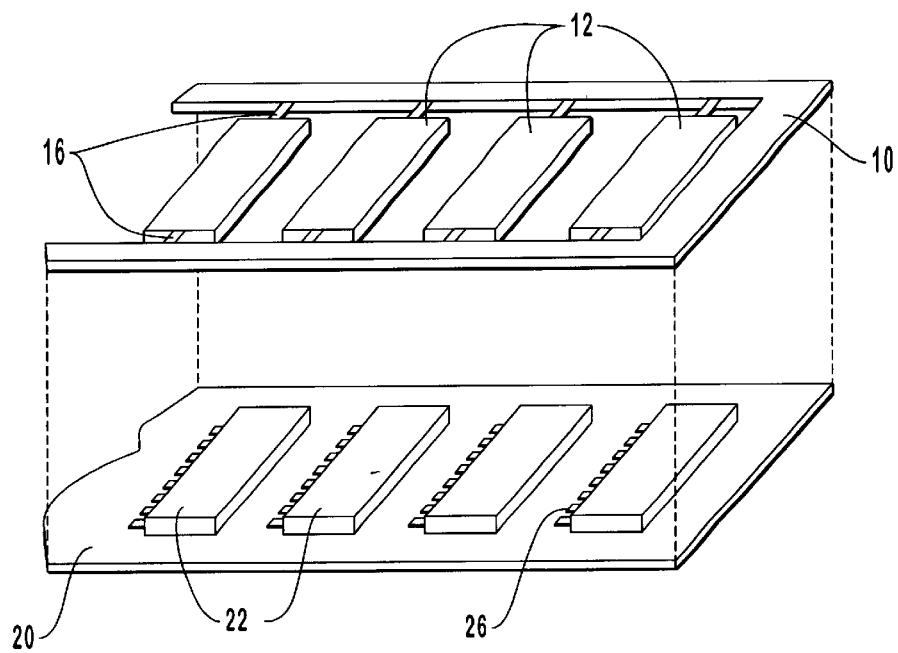
FIG. 1 is a perspective view of a heat sink frame having a plurality of heat sinks attached thereto and a semiconductor chip frame having a plurality of semiconductor chips positioned thereon.

One design and configuration of a preferred heat sink frame is presented in FIG. 1 by way of example, and not by limitation. Heat sink frame 10 is preferably a generally flat member that is adjacent to, and may encircle, a plurality of heat sinks 12. Heat sink frame 10 and heat sinks 12 may be advantageously formed from the same material. For example, heat sinks 12 are preferably formed from a metal material that has suitable thermal properties in order to draw excess heat from a corresponding semiconductor chip. Examples of such metal materials include, but are not limited to, nickel, copper, palladium, and alloys of the foregoing. Alternatively, heat sinks 12 may be formed from any other material that has acceptable thermal properties.

If heat sink frame 10 is made from the same material as heat sinks 12, both may be integrally formed from one sheet of metal, for example. Heat sinks 12 are preferably connected to heat sink frame 10 in a manner such that heat sinks 12 are easily detachable. According to one suitable method depicted in FIG. 1, the connection is established at one or more contact points 16 located about the periphery of heat sink 12. When connection is made at a set of discrete contact points 16, a sufficiently strong shearing force applied between heat sink frame 10 and heat sinks 12 will generally cause failure of the material of contact points 16, with the result that heat sink frame 10 may be reliably removed. However, there are many other available alternatives for connecting heat sinks 12 with heat sink frame 10. For example, the interface therebetween may be perforated in order to facilitate the detachment of heat sink frame 10. Alternatively, the interface may be continuous, but may have a reduced thickness in order to allow separation between heat sinks 12 and heat sink frame 10 at the desired location.

Heat sink frame 10 may optionally be constructed of a different material than heat sinks 12. In this case, heat sinks 12 may be constructed separately from frame 10 and may be subsequently attached thereto. Is should be understood that the specific material used in heat sink frame 10 is not critical to the invention.

In practice, heat sink frame 10 may support one or many heat sinks 12. Of course, using one frame 10 with a plurality of heat sinks 12 generally increases the efficiency of the chip packaging process, since alignment of heat sink frame 10 with a semiconductor chip frame 20 thereby simultaneously aligns all of the attached heat sinks 12 with a corresponding plurality of semiconductor chips 22. The configuration of heat sink frame 10, the number of attached heat sinks 12, and the spacing and alignment of heat sinks 12 is often at least partially dictated by the molding machine and the other processing equipment that are used. In many situations, it is useful to have heat sink frame 10 take the form of a strip having a length dimension perhaps several times larger than its width dimension. Moreover, heat sinks 12 may often be advantageously supported in a generally linear configuration by heat sink frame 10.

The heat sink frames of the invention are certainly not limited to the specific example depicted in FIG. 1. Heat sink frame 10 may be co-planar with heat sinks 12 as depicted in FIG. 1 or, alternatively, may be located in another position such as over heat sinks 12. Furthermore, the heat sinks are not limited to structures that encircle the plurality of heat sinks 12 as depicted in FIG. 1. Instead, heat sink frame 10 may be adjacent to as few as one side of each attached heat sink 12. While FIG. 1 illustrates one row of heat sinks 12, it should be understood that the invention extends to any other pattern of heat sinks 12. For example, a heat sink frame may accommodate multiple rows or columns of heat sinks 12. In view of the foregoing, it is to be understood that the heat sink frames of the invention extend to any structures removably attached to heat sinks, so long as the structures may be used to support, align, or otherwise position the heat sinks near the corresponding semiconductor chips.

FIG. 1 further illustrates but one example of a semiconductor chip frame 20 that may be used in conjunction with the heat sinks and the heat sink frames of the invention. Semiconductor chip frame 20 is a strip or other structure used to support semiconductor chips 22 preferably in substantially the same pattern as the corresponding heat sinks 12. Semiconductor chip frame 20 advantageously may be a structure that has electrical leads 26 inscribed thereon. Thus, sections of frame 20 can become the lead frames for semiconductor chips 22 after the chip packaging process is completed and the semiconductor chip frame 20 has been sectioned into individual units.

Figure 2:
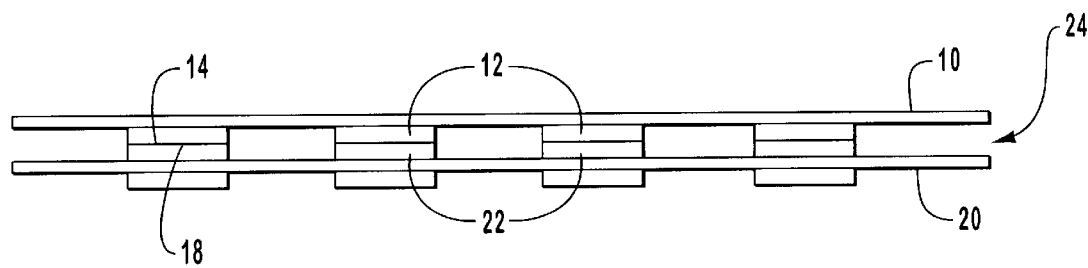
FIG. 2 is an elevation view of a dual frame assembly including a heat sink frame and a semiconductor chip frame according to one embodiment of the invention.

FIG. 2 is an elevation view of a dual frame assembly 24 that is formed when heat sink frame 10 is combined with semiconductor chip frame 20. As illustrated, each heat sink 12 is preferably positioned on or near a corresponding semiconductor chip 22 such that a surface 14 of heat sink 12 is brought into proximity to a face 18 of semiconductor chip 22. The heat sinks 12 and the semiconductor chips 22 may be advantageously secured together by means of an adhesive layer (not shown) at the interface therebetween using adhesives that will be understood by persons of ordinary skill in the art. Alternatively, heat sinks 12 may simply rest on semiconductor chips 22.

Figure 3:
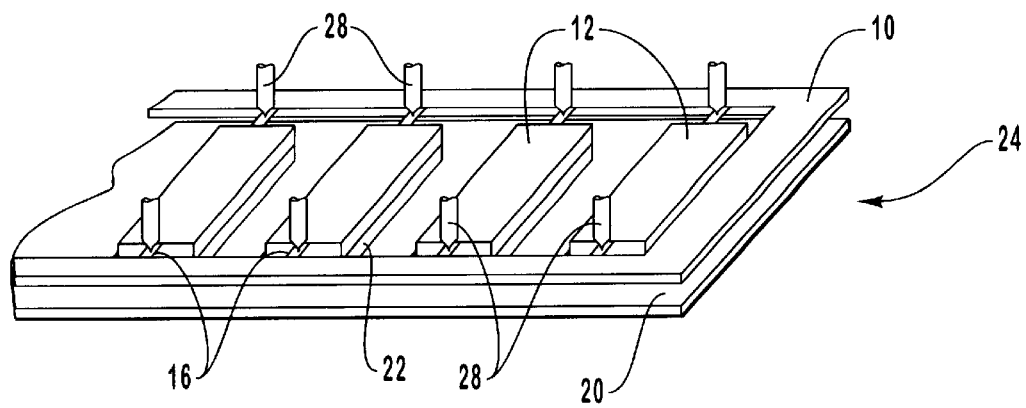
FIG. 3 is a perspective view of the dual frame assembly of FIG. 2 showing the positioning of singulation pins in preparation for a molding step.

FIG. 3 illustrates dual frame assembly 24 having been prepared for a subsequent step of detaching heat sink frame 10 from heat sinks 12 and a molding operation. Singulation pins 28, which constitute a part of a loading system for introducing dual frame assembly 24 into a molding machine, are positioned adjacent to heat sink frame 10. Singulation pins 28 are used to separate frame 10 from heat sinks 12 by directing a shearing force onto contact point 16. Of course, structures other than singulation pins 28 may be used to facilitate separation of frame 10 from heat sinks 12 and to align dual frame assembly 24 for loading into a molding machine. Generally, heat sink frame 10 is removed by generating a shearing force at contact points 16 by applying a force directly to contact points 16 or by applying countervailing forces to frame 10 and heat sinks 12. Additionally, the invention may be adapted for use with a wide variety of molding machines that may be known in the art.

Figure 4:
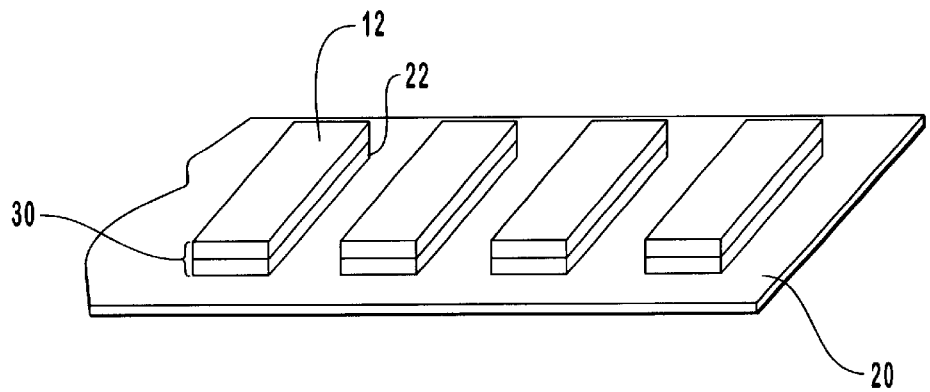
FIG. 4 is a perspective view of the dual frame assembly of FIG. 3 after the heat sink frame has been removed.

The structure formed upon removal of heat sink frame 10 is illustrated in FIG. 4. In particular, heat sinks 12 remain disposed over semiconductor chips 22 so as to form heat sink and chip assemblies 30. It is noted that, depending on the directional frame of reference, heat sinks 12 could equally be described as being disposed under, to the side of, etc., with respect to semiconductor chips 22. Accordingly, "over", as used herein, is intended to encompass other directional terms as well. Preferably, detachment of heat sink frame 10 is conducted shortly before the resulting heat sink and chip assemblies are encapsulated. Alternatively, however, detachment of heat sink frame 10 may instead be conducted at any prior time.

Figure 5:
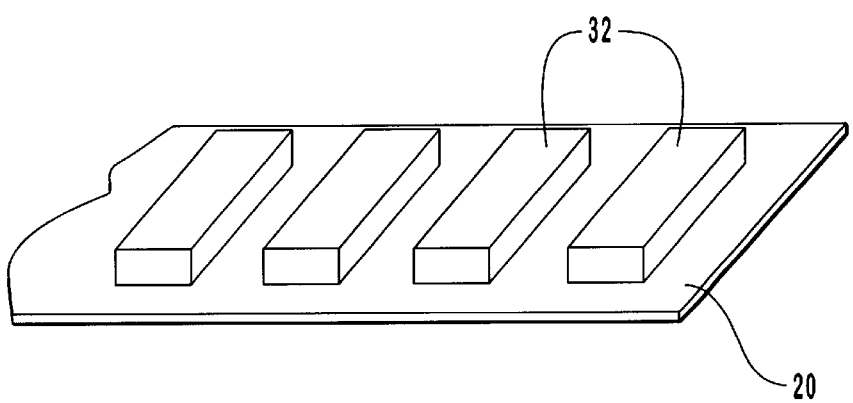
FIG. 5 is a perspective view of the structure of FIG. 4 after the heat sinks and semiconductor chips have been substantially encapsulated within a molding material.

FIG. 5 depicts an encapsulation layer 32 having been formed over the heat sink and chip assemblies. Accordingly, the heat sinks and the semiconductor chips are at least partially encapsulated and are preferably substantially encapsulated. In particular, at least one surface of semiconductor chips 22 is preferably encapsulated. A heat sink or a semiconductor chip is considered to be "substantially encapsulated" if its previously exposed surfaces are substantially covered by the encapsulation layer or material. Encapsulation layer 32 may be formed according to well-known methods of the chip packaging art. Typically, encapsulation is conducted by placing the heat sinks and the semiconductor chips on a molding surface at or in proximity to the molding machine and then loading or introducing the heat sinks and semiconductor chips into the molding machine.

Encapsulation layer 32 may comprise any molding or other material, including those that are commonly used in the art to encapsulate semiconductor chips. Thus, encapsulation layer 32 is a protective coating over heat sinks 12 and semiconductor chips 22. After the molding step, encapsulation layer 32 may be trimmed as needed to remove excess material therefrom. Subsequently, semiconductor chip frame 20 may be sawed or otherwise sectioned into units, and the resulting encapsulated chips may be further processed as desired.

Figure 6:
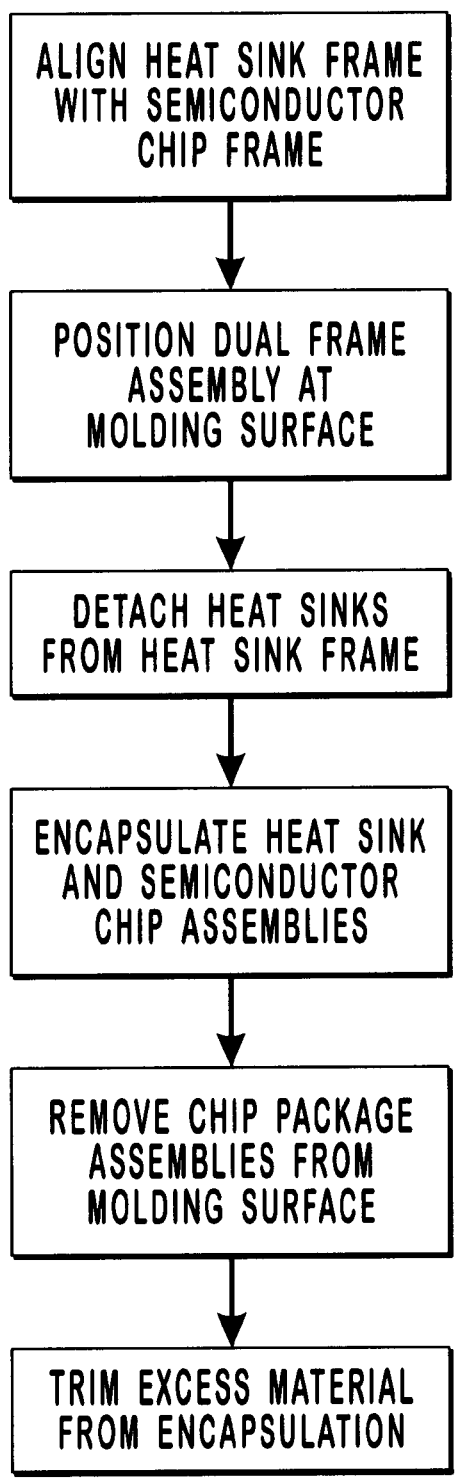
FIG. 6 is a flow diagram setting forth selected steps of the process of forming the structure of FIG. 5.

FIG. 6 summarizes selected steps of a preferred method for forming the structure of FIG. 5. However, it should be understood that order of the steps may be changed in some respects from that which is illustrated. For example, the step of aligning the heat sink frame with the semiconductor chip frame may instead be conducted concurrently with or after the step of positioning the dual frame assembly at the molding surface. Additionally, the step of detaching the heat sinks from the heat sink frame may alternatively be performed concurrently with or before the step of positioning the dual-frame assembly at the molding surface.

Figure 7:
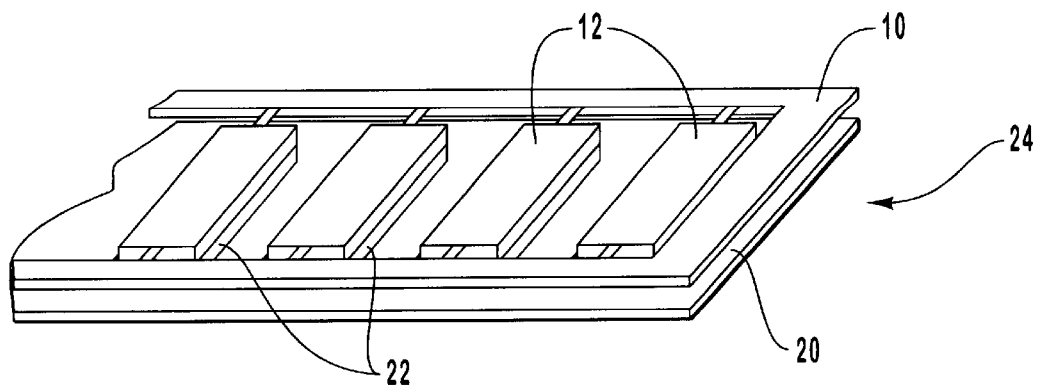
FIG. 7 is a perspective view of a dual frame assembly including a heat sink frame and a semiconductor chip frame according to another embodiment of the invention.
Figure 8:
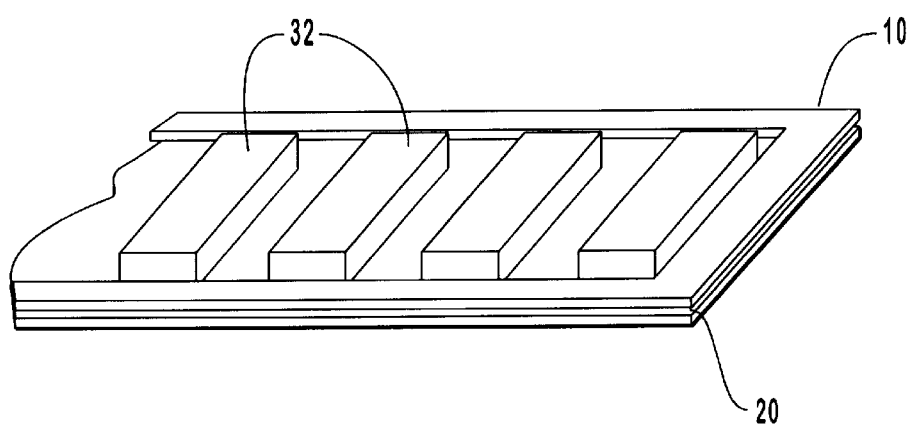
FIG. 8 is a perspective view of the dual frame assembly of FIG. 7 after a molding step has been conducted.

A second embodiment of the invention is described in reference to FIGS. 7–10. In FIG. 7, heat sink frame 10 has been aligned with semiconductor chip frame 20 in order to form dual frame assembly 24. Frame 10 and frame 20 and their associated heat sinks 12 and semiconductor chips 22 may be similar or identical to the corresponding components described in reference to the first embodiment of the invention in FIGS. 1–6. The dual frame assembly 24 is loaded into a molding machine, wherein an encapsulation operation is conducted on the heat sink and chip assemblies. Accordingly, the encapsulated chips shown in FIG. 8 are formed over semiconductor chip frame 20 while heat sink frame 10 remains attached to the heat sinks. The encapsulated chips are subsequently removed from the molding machine and heat sink frame 10 is detached from heat sinks 12 in order to form the structure depicted in FIG. 9.

Figure 9:
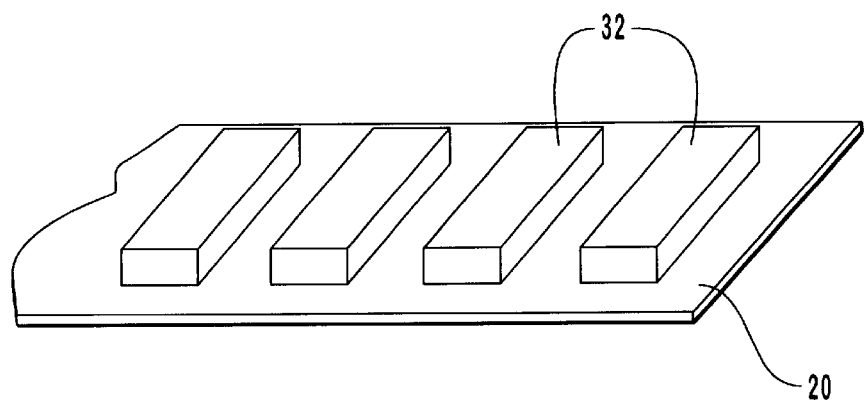
FIG. 9 is a perspective view of the structure of FIG. 8 after the heat sink frame has been removed.
Figure 10:
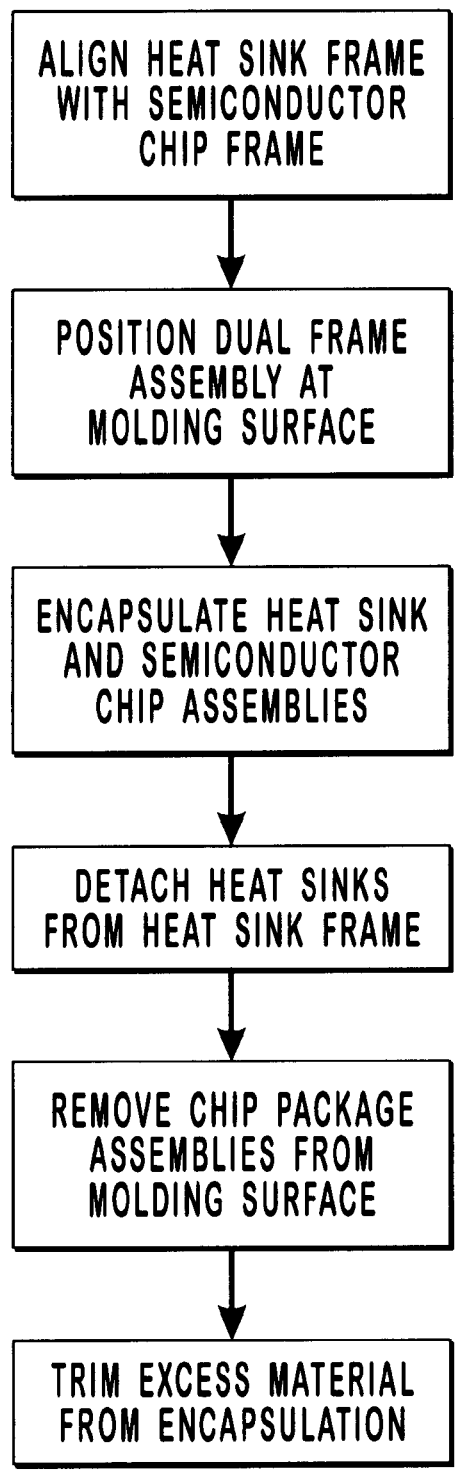
FIG. 10 is a flow diagram setting forth selected steps of the process of forming the structure of FIG. 9.
Figure 11:
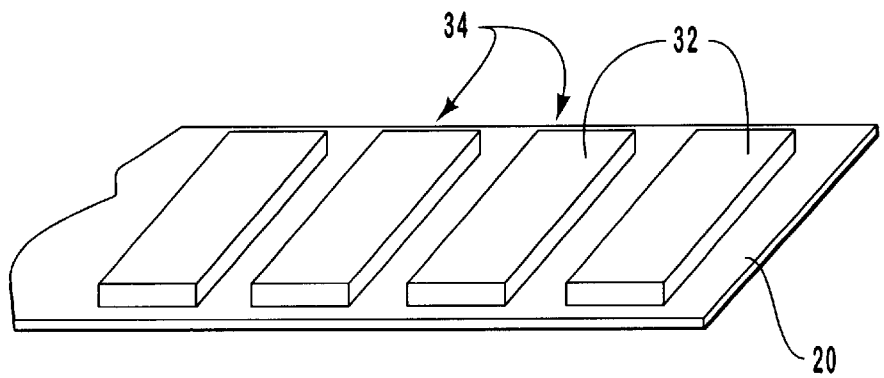
FIG. 11 is a perspective view of a semiconductor chip frame wherein the semiconductor chips have been substantially encapsulated within a molding material.

FIG. 10 sets forth selected steps of a preferred method for forming the structure of FIG. 9. However, it should be understood that order of the steps may be changed in some respects from that which is illustrated. For example, the step of detaching the heat sinks from the heat sink frame may be performed at any time after the heat sink and chip assemblies are encapsulated. This step may be performed before, during, or after either of the step of removing the chip package assemblies from the molding surface or the step of trimming excess material from the encapsulation.

The two embodiments depicted in FIGS. 1–10 have the advantage of substantially encapsulating not only the semiconductor chips, but also the heat sinks. In this manner, the heat sinks may be placed in intimate contact with the semiconductor chips in order to efficiently remove excess heat therefrom. Moreover, encapsulation material substantially surrounding the heat sink adequately secures the heat sink in position on or near the semiconductor chip.

The invention extends to a third embodiment illustrated in FIGS. 11–14, in which the heat sinks are combined with the semiconductor chips that have already been encapsulated. In a first step, a semiconductor chip frame 20 is loaded into a molding machine wherein the semiconductor chips are at least partially, and preferably substantially, encapsulated. It is noted that semiconductor chip frame 20 of FIG. 11 and the other components and materials described in reference to this embodiment may be similar or identical with their counterparts that have been disclosed in reference to the previous embodiments of the invention.

Figure 12:
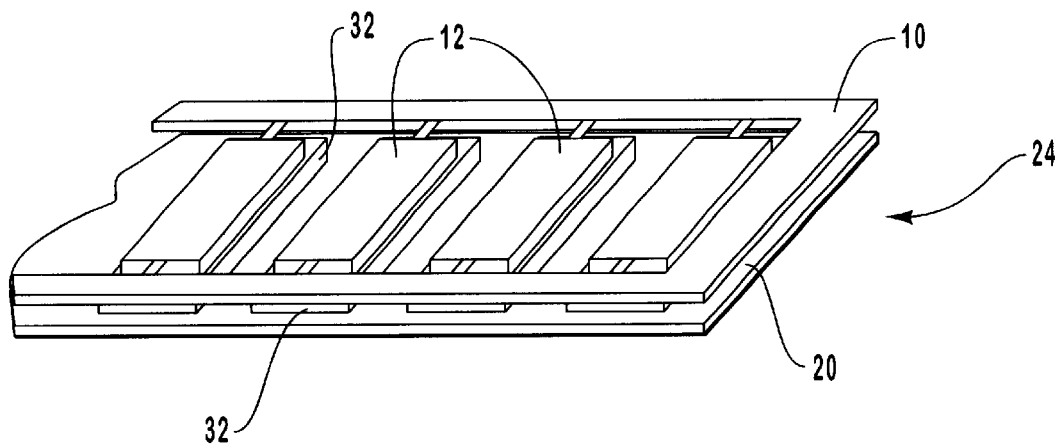
FIG. 12 is a perspective view of a dual frame assembly including a heat sink frame and the semiconductor chip frame of FIG. 11 wherein the heat sinks are disposed on the encapsulation layer.

After the molding operation has been performed such that encapsulated chips 34 are formed, heat sink frame 10 is aligned with semiconductor chip frame 20 as illustrated in FIG. 12. Heat sinks 12 may be secured over encapsulated chips 34 by means of an adhesive layer (not shown) at the interface therebetween. Alternatively, when appropriate molding materials are used in the encapsulation layer 32, heat sinks 12 may be attached thereto without the used of additional adhesive materials. For example, placing heat sinks 12 in contact with some molding materials before the molding materials have fully cured may provide adequate adhesion between heat sinks 12 and encapsulated chips 34.

After heat sinks 12 are in position over encapsulated chips 34, heat sink frame 10 is detached from heat sinks 12 to form heat sink and chip assemblies 36. Thereafter, the structure of FIG. 13 may be further processed as desired in order to form completed packaged chips. For example, frame 20 may be sawed or otherwise divided into singulated units. Optionally, heat sink and chip assemblies 36 may be further encapsulated so as to substantially cover heat sinks 12. Preferably, however, heat sinks 12 remain exposed to the surroundings, as seen in FIG. 13.

Figure 13:
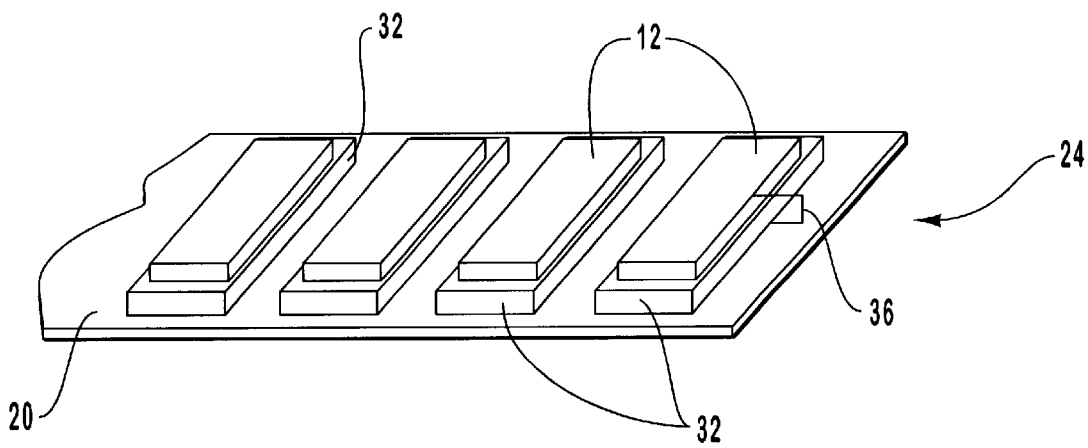
FIG. 13 is a perspective view of the structure of FIG. 12 after the heat sink frame has been removed.
Figure 14:
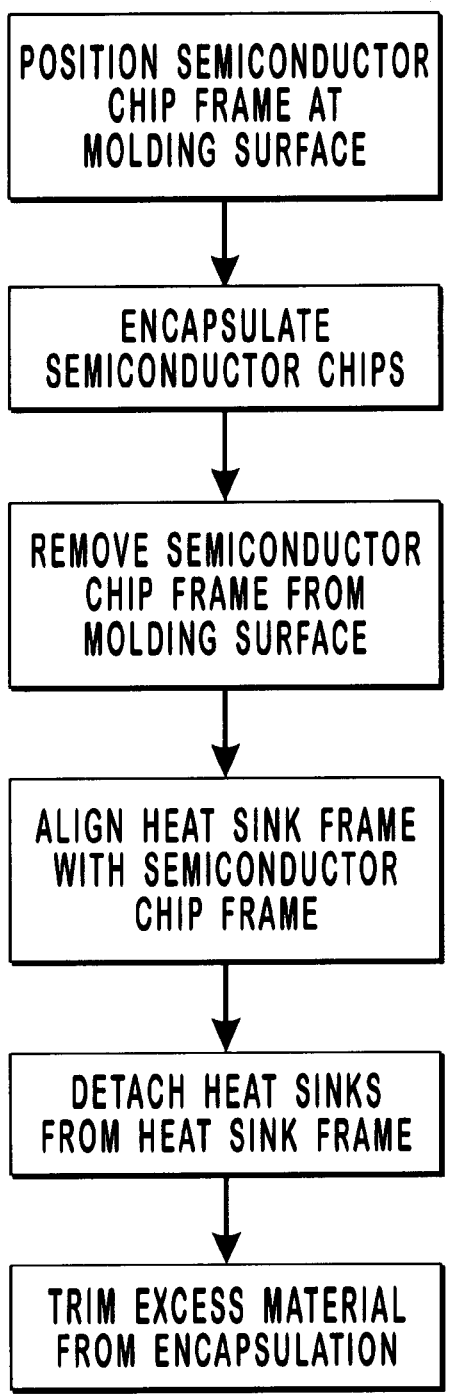
FIG. 14 is a flow diagram setting forth selected steps of the process of forming the structure in FIG. 13.

FIG. 14 sets forth selected steps of a preferred method for forming the structure of FIG. 13. However, it should be understood that order of the steps may be changed in some respects from that which is illustrated. For example, the step of aligning the heat sink frame with the semiconductor chip frame may instead be conducted at any other desired time after the semiconductor chips are encapsulated. One alternative is to align the heat sink frame before the semiconductor frame is removed from the molding surface. Likewise, the heat sink frame may be detached from the heat sinks at any desired time after alignment of the heat sink frame. For instance, this step may be performed while the semiconductor chip frame remains on the molding surface or may be performed before, during, or after the step of trimming excess material from the encapsulation. Other variations in the order of the steps are possible in this and the other embodiments while still remaining within the scope of the invention. Finally, the heat sink frames of the invention may be used to align heat sinks with semiconductor chips at any other desired stage of a chip packaging process other than those specifically identified herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for packaging semiconductor chip with heat sink assemblies, the method comprising:
    providing a first frame having a plurality of semiconductor chips positioned thereon;
    providing a second frame having a plurality of heat sinks attached thereto by a frangible attachment structure;
    disposing said second frame over said first frame such that each of said plurality of heat sinks is disposed over one of said plurality of semiconductor chips, thereby forming a plurality of heat sink and semiconductor chip assemblies; and
    at least partially encapsulating each of said plurality of heat sink and semiconductor chip assemblies with a protective coating.

2. A method as defined in claim 1, wherein the first frame has a plurality of electrical leads thereon, the method further comprising sectioning the first frame into a plurality of lead frames such that each said semiconductor chip is attached of one of said lead frames.

3. A method as defined in claim 1, wherein:
    said first frame comprises a first strip having said plurality of chips positioned thereon in a generally linear configuration; and
    said second frame comprises a second strip having said plurality of heat sinks attached thereto in a generally linear configuration.

4. A method as defined in claim 1, wherein said plurality of heat sinks are attached to said second frame at a plurality of discrete contact points on the periphery of each of said plurality of heat sinks.

5. A method as defined in claim 1, wherein said at least partially encapsulating is performed before said disposing said second frame over said first frame.

6. A method as defined in claim 1, wherein said at least partially encapsulating is performed after said disposing said second frame over said first frame.

7. A method for packaging heat sinked semiconductor chip assemblies, said method comprising:
    providing a first frame having a plurality of semiconductor chips positioned thereon;
    providing a second frame having a plurality of heat sinks attached thereto by a frangible attachment structure;
    disposing said second frame over said first frame such that each of said plurality of heat sinks is disposed over one of said plurality of semiconductor chips, thereby forming a plurality of heat sinked semiconductor chip assemblies; and
    at least partially encapsulating each of said plurality of heat sinked semiconductor chip assemblies with a protective coating.

8. A method as defined in claim 7, wherein the first frame has a plurality of electrical leads thereon, the method further comprising sectioning the first frame into a plurality of lead frames such that each said semiconductor chip is attached of one of said lead frames.

9. A method as defined in claim 7, wherein:
    said first frame comprises a first strip having said plurality of chips positioned thereon in a generally linear configuration; and
    said second frame comprises a second strip having said plurality of heat sinks attached thereto in a generally linear configuration.

10. A method as defined in claim 7, further comprising removing excess material from said protective coating.

11. A method as defined in claim 7, wherein said plurality of heat sinks are attached to said second frame at a plurality of discrete contact points on the periphery of each of said plurality of heat sinks.

12. A method for packaging heat sinked semiconductor chip assemblies, said method comprising:
    providing a first frame having a plurality of semiconductor chips positioned thereon;
    at least partially encapsulating each of said plurality of semiconductor chips such that each of said plurality of semiconductor chips has one of a plurality of curable protective coatings disposed thereon;
    providing a second frame having a plurality of heat sinks attached thereto by a frangible attachment structure; and
    disposing said second frame over said first frame such that each of said plurality of heat sinks is disposed on one of said plurality of protective coatings, thereby forming a plurality of heat sinked semiconductor chip assemblies.

13. A method as defined in claim 12, wherein:
    said first frame comprises a first strip having said plurality of chips positioned thereon in a generally linear configuration; and
    said second frame comprises a second strip having said plurality of heat sinks attached thereto in a generally linear configuration.

14. A method as defined in claim 12, wherein disposing said second frame over said first frame comprises attaching said plurality of heat sinks to said plurality of protective coatings by means of an adhesive.

15. A method as defined in claim 12, wherein disposing said second frame over said first frame is conducted before said plurality of curable protective coatings have cured, whereby said plurality of heat sinks adhere to said plurality of protective coatings.

16. A method as defined in claim 12, wherein the first frame has a plurality of electrical leads thereon, the method further comprising sectioning the first frame into a plurality of lead frames such that each said semiconductor chip is attached of one of said lead frames.

17. A method as defined in claim 7, wherein said at least partially encapsulating is performed after said disposing said second frame over said first frame.

* * * * *

UNITED STATES PATENT AND TRADEMARK OFFICE
CERTIFICATE OF CORRECTION

PATENT NO. : 6,355,506 B1
DATED : March 12, 2002
INVENTOR(S) : Joseph M. Brand

It is certified that error appears in the above-identified patent and that said Letters Patent is hereby corrected as shown below:

Column 2,
Line 17, after "the" delete the period

Column 5,
Line 8, before "preferably" delete [s]

Column 6,
Line 7, before "should" change "Is" to -- It --

Column 8,
Line 47, after "without the" change "used" to -- use --

Signed and Sealed this

Twelfth Day of November, 2002

Attest:

Attesting Officer

JAMES E. ROGAN
*Director of the United States Patent and Trademark Office*